(12) United States Patent
Cohn et al.

(10) Patent No.: US 7,088,124 B2
(45) Date of Patent: *Aug. 8, 2006

(54) UTILIZING CLOCK SHIELD AS DEFECT MONITOR

(75) Inventors: John M. Cohn, Richmond, VT (US); Leah M. P. Pastel, Essex, VT (US); Thomas G. Sopchak, Williston, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/280,008

(22) Filed: Nov. 16, 2005

(65) Prior Publication Data

US 2006/0066342 A1   Mar. 30, 2006

Related U.S. Application Data

(62) Division of application No. 10/710,222, filed on Jun. 28, 2004, now Pat. No. 7,005,874.

(51) Int. Cl.
*G01R 31/02* (2006.01)

(52) U.S. Cl. .................................. 324/765; 324/158.1

(58) Field of Classification Search ................ 324/765, 324/73.1, 158.1; 714/724–733; 326/93; 327/290–291
See application file for complete search history.

(56) References Cited

U.S. PATENT DOCUMENTS

| | | | |
|---|---|---|---|
| 4,419,752 A | 12/1983 | Sonnenberger et al. | |
| 4,833,672 A | 5/1989 | Steely | |
| 5,519,327 A * | 5/1996 | Consiglio | ................ 324/678 |
| 6,006,025 A | 12/1999 | Cook et al. | |
| 6,061,814 A | 5/2000 | Sugasawara et al. | |
| 6,353,352 B1 | 3/2002 | Sharpe-Geisler | |
| 6,610,550 B1 | 8/2003 | Pasadyn et al. | |
| 8,613,590 | 9/2003 | Simmons | |
| 6,952,117 B1 | 10/2005 | Forbes | |
| 7,005,874 B1 * | 2/2006 | Cohn et al. | ................ 324/765 |

\* cited by examiner

*Primary Examiner*—Vinh P. Nguyen
(74) *Attorney, Agent, or Firm*—Gibb I.P. Law Firm, LLC; William D. Sabo, Esq.

(57) ABSTRACT

Disclosed is a shielded clock tree that has one or more clock signal buffers and clock signal splitters, with clock signal wiring connecting the clock signal buffers to the clock signal splitters. Shielding is adjacent the clock signal wiring, where ground wiring connects the shielding to ground. The shielding comprises shield wires positioned adjacent and parallel to the clock signal wiring. The invention provides switches in the ground wiring, and these switches are connected to, and controlled by, a test controller.

7 Claims, 5 Drawing Sheets

UTILIZING CLOCK SHIELD AS DEFECT MONITOR

CROSS-REFERENCE TO RELATED APPLICATIONS

This application is a division of U.S. application Ser. No. 10/710,222, filed on Jun. 28, 2004, now U.S. Pat. No. 7,005,874.

BACKGROUND OF THE INVENTION

1. Field of the Invention

The present invention generally related to shielded clock trees and more particularly to a shielded clock tree that includes switches in the ground wiring that connects the shields to ground, where the switches are adapted to connect the shielding to ground during non-test operations and to selectively disconnect the shielding from ground during test operations.

2. Description of the Related Art

Clock shielding is used to electrically isolate major portions of a clock tree within an integrated circuit structure. In general, the shielding is used on all portions of the clock tree up to the clock splitters. The shielding is generally implemented as grounded, minimum size, and minimum spaced wires on either side of the clock running segment, as shown in FIG. 1. More specifically, FIG. 1 illustrates a clock buffer (SCB) 100 that provides a main clock signal along the main clock signal lines 102. This main clock signal is distributed along the main clock signal lines 102 to secondary structured clock buffers 104 which provide the secondary clock signals. The secondary clock signals are transmitted along secondary clock signal lines 106 to clock splitters 108. The shields 110 are adjacent and parallel to the main clock signal lines 102 and secondary clock signal lines 106, and are conventionally grounded as shown in FIG. 1.

Shielding is an AC effect and, therefore, shields may be alternately tied to VDD. There are 2 types of effects that this shielding helps fix. In the first, these grounded signals help prevent unwanted capacitive coupling from the clock to adjacent signals (or visa versa). In the second, these shields provide a low impedance return path for the currents induced inductively by the changing current on the clocks. Without these shield, those currents find their way back through adjacent signals and the chip substrate which can cause unwanted timing variation. Because the shielding introduces many millimeters of minimum space parallel routing, this technique typically decreases yield due to increased sensitivity to defects. Defects in the die are detected by fails at test. With the clock shielding structure shown in FIG. 1, a defect which shorts a clock wire to a shield, will cause a fail at test, and the die or module would be scrapped. However, with conventional structures, the root cause of the test fail will be unknown. Valuable information relating to the root cause of the test fail, such as the defect density, defect location or process levels involved, is not directly provided from the conventional test results. At manufacturing test, this defect will typically fail the quiescent current (Iddq) test or a pattern test (AVP/LSSD/etc.). Chips with this defect will be grouped with other chips that fail these test categories. While logic diagnostics, Iddq diagnostics, physical fault isolation, or tester base diagnostics techniques may be used to determine the location of the defect and root cause, determining defect location and root cause for a large number of manufactured chips can be time and resource intensive. The invention described below addresses these concerns.

SUMMARY OF THE INVENTION

This invention modifies the clock shielding wires to allow them to double as sensitive defect monitors. This on-product approach tracks actual product defect levels more accurately, provides substantial critical area in which to detect defects, and uses less dedicated silicon area than traditional kerf-based defect monitors. This invention replaces the fixed wiring used to bias the shields to ground with circuits that can switch the shields into a high impedance state or connect them to ground. These circuits can be used to detect defects, which have shorted the shield to the clock. By controlling the selection of these switches, detailed information regarding the frequency and layer of defects can be gathered on a large number of manufactured chips.

More specifically, this disclosure presents a method of testing a shielded clock tree within an integrated circuit. The shielded clock tree has one or more clock signal buffers and clock signal splitters, with clock signal wiring connecting the clock signal buffers to the clock signal splitters. Shielding is adjacent the clock signal wiring, where ground wiring connects the shielding to ground or Vdd (e.g., predetermined voltage level). The shielding comprises shield wires positioned adjacent and parallel to the clock signal wiring. The invention provides switches in the ground wiring, and these switches are connected to, and controlled by, a test controller.

The invention first performs initial testing of the shielded clock tree. If the shielded clock tree fails the initial testing, the invention activates the switches that are connected to the shielding that is adjacent to the clock signal wiring to disconnect the shielding from ground, and then retests the shielded clock tree. If the shielded clock tree passes this retesting process, this indicates that the initial test failure was probably caused by one of the clock signal wires shorting to ground through one of the shields. Therefore, if the shielded clock tree passes the retesting process, in order to determine the location of the defect, the invention selectively activates the switches to selectively disconnect portions of the shielding from ground (e.g., disconnecting one or more shield wire at a time), and then repeatedly tests the shielded clock tree with different switches activated to locate one or more defects. During this process of disconnecting individual (or groups of) shield wires from ground, if the shielded clock tree passes the retesting process, this indicates that a short between a clock signal wire and the shield wire(s) that was disconnected may be one of the sources of the defect(s) that caused the shielded clock tree to fail the initial testing. This allows the invention to know precisely which shield wire (or group of shield wires) has potentially caused the defect. This, in turn, allows the circuit design, circuit layout, or manufacturing process to be analyzed and corrected.

The switches are adapted to connect the shielding to ground during non-test operations and to selectively disconnect the shielding from ground during test operations. The switches are individually controllable such that different portions of the shielded clock tree can be isolated to locate defects. Each of the switches can be connected to a plurality of ground wires. The clock signal buffer can comprise a main clock signal buffer connected to a plurality of secondary clock signal buffers by the clock signal wiring.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
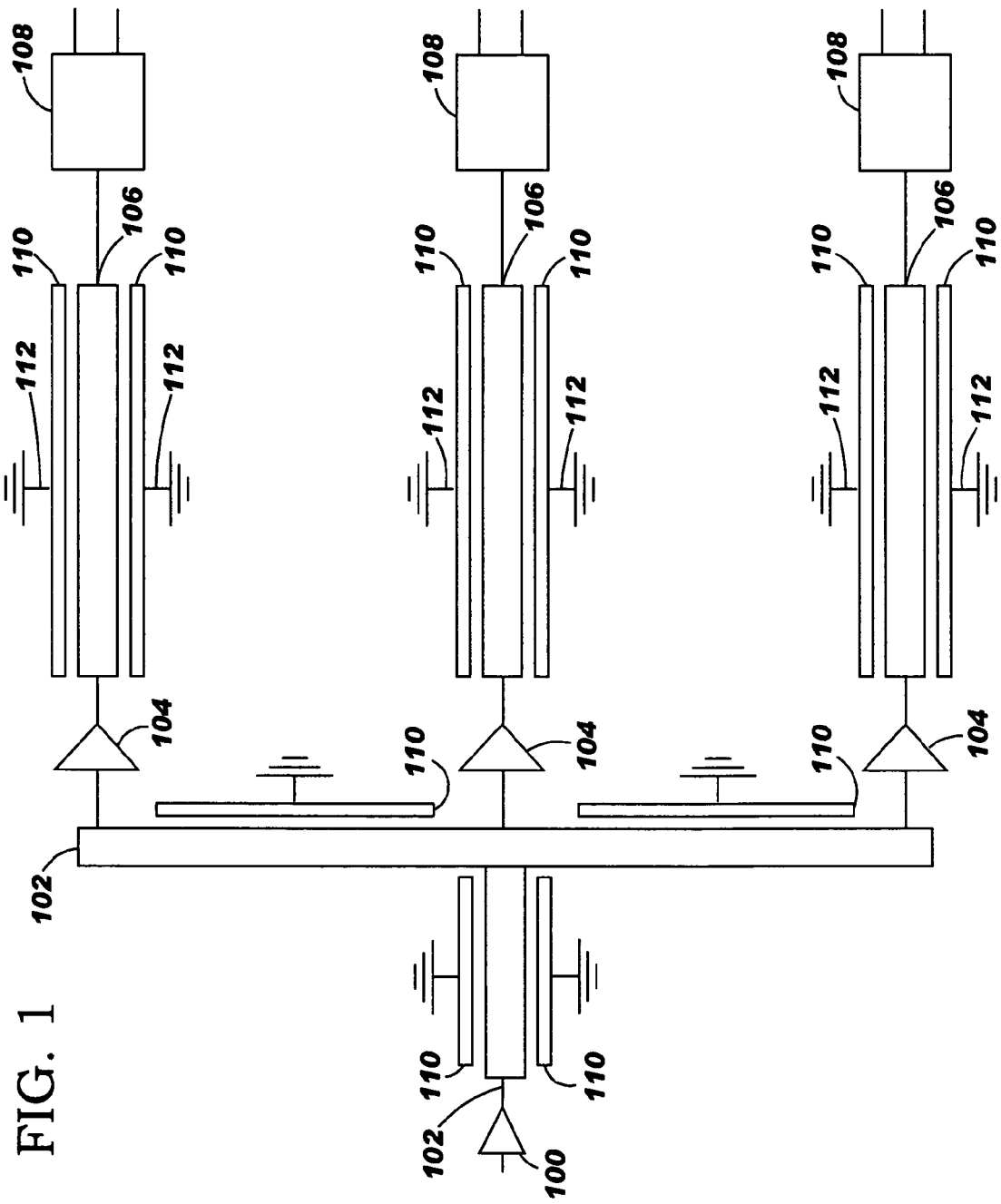
FIG. 1 is a schematic diagram of a shielded clock circuit.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

In this invention the hardwired bias to the shields is replaced with a circuit which can optionally tie the shields to ground or let them float based on a test control signal. In the tied-down state, the shields provide a shielding effect to the clock signal wires. In the defect test mode, the shields are allowed to float, to determine whether any of the clock signal wires are shorted against the grounded shields.

Figure 2:
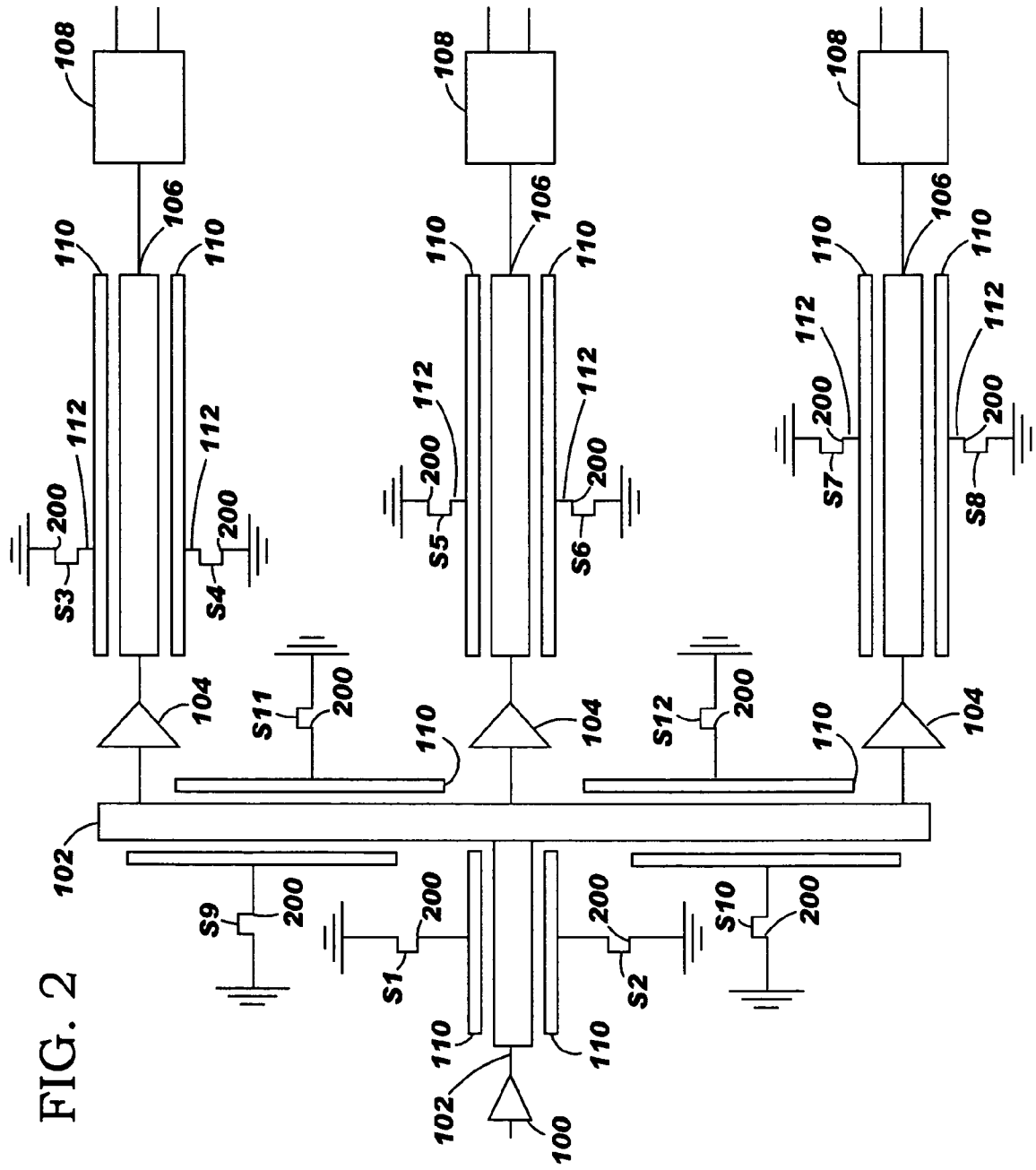
FIG. 2 is a schematic diagram of a shielded clock circuit with switches.

More specifically, FIG. 2 illustrates a shielded clock tree that has one or more clock signal buffers 100, 104 and clock signal splitters 108, with clock signal wiring 102, 106 connecting the clock signal buffers 100, 104 to the clock signal splitters 108. The clock signal buffers include a main clock signal buffer 100 connected to a plurality of secondary clock signal buffers 104 by primary clock signal wiring 102. The secondary clock signal buffers 104 are connected to the clock signal splitters 108 by secondary clock signal wiring 106.

Figure 3:
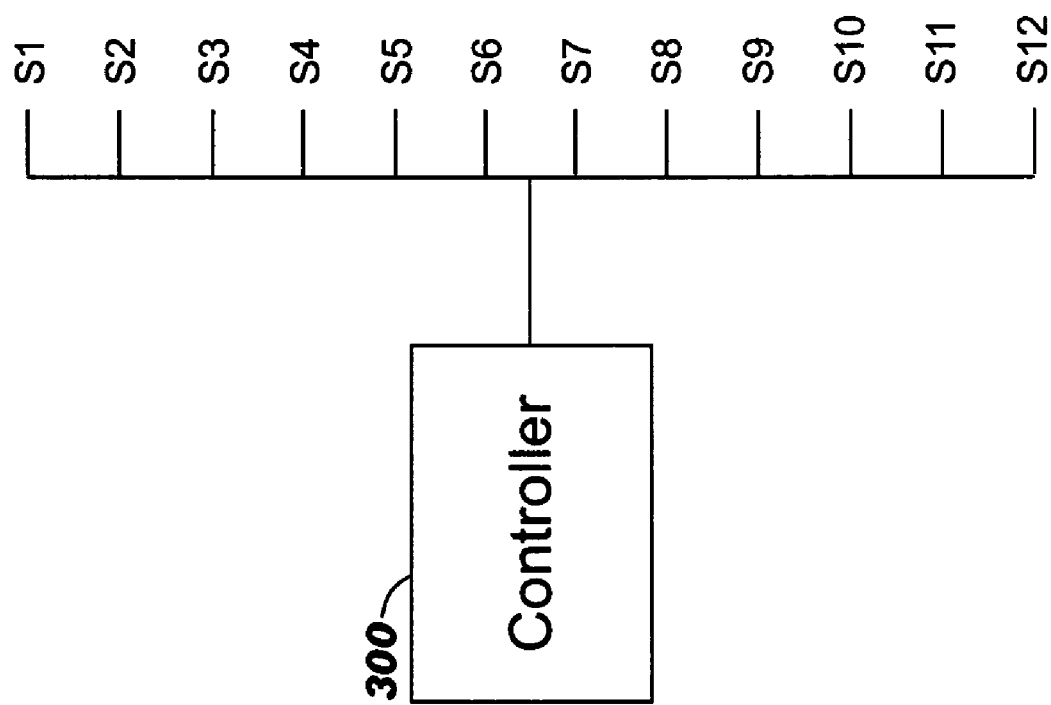
FIG. 3 is a schematic diagram of a controller connected to the switches in FIG. 2.

Shielding is adjacent to the primary and secondary clock signal wiring 102, 106, where ground wiring 112 connects the shielding to ground (e.g., predetermined voltage level). The shielding comprises shield wires 110 positioned adjacent and parallel to the clock signal wiring 102, 106. The invention provides switches 200 (e.g., transistors) in the ground wiring 112, and these switches 200 are connected to, and controlled by, a test controller, such as the test controller 300 shown in FIG. 3. Note that signals lines S1–S8 allow the controller 300 to control each of the switches 200 individually.

The switches 200 are adapted to connect the shielding to ground during non-test operations and to selectively disconnect the shielding from ground during test operations. The switches 200 are individually controllable such that different portions of the shielded clock tree can be isolated to locate defects. While the drawings illustrate that each ground wiring 112 has a dedicated switched 200, as would be understood by one ordinarily skilled in the art, each of the switches 200 can be connected to a plurality of ground wires. Further, each ground wire 112 could connect many shield wires 110 to ground and individual ground wires are illustrated in the drawings for simplicity.

Figure 4:
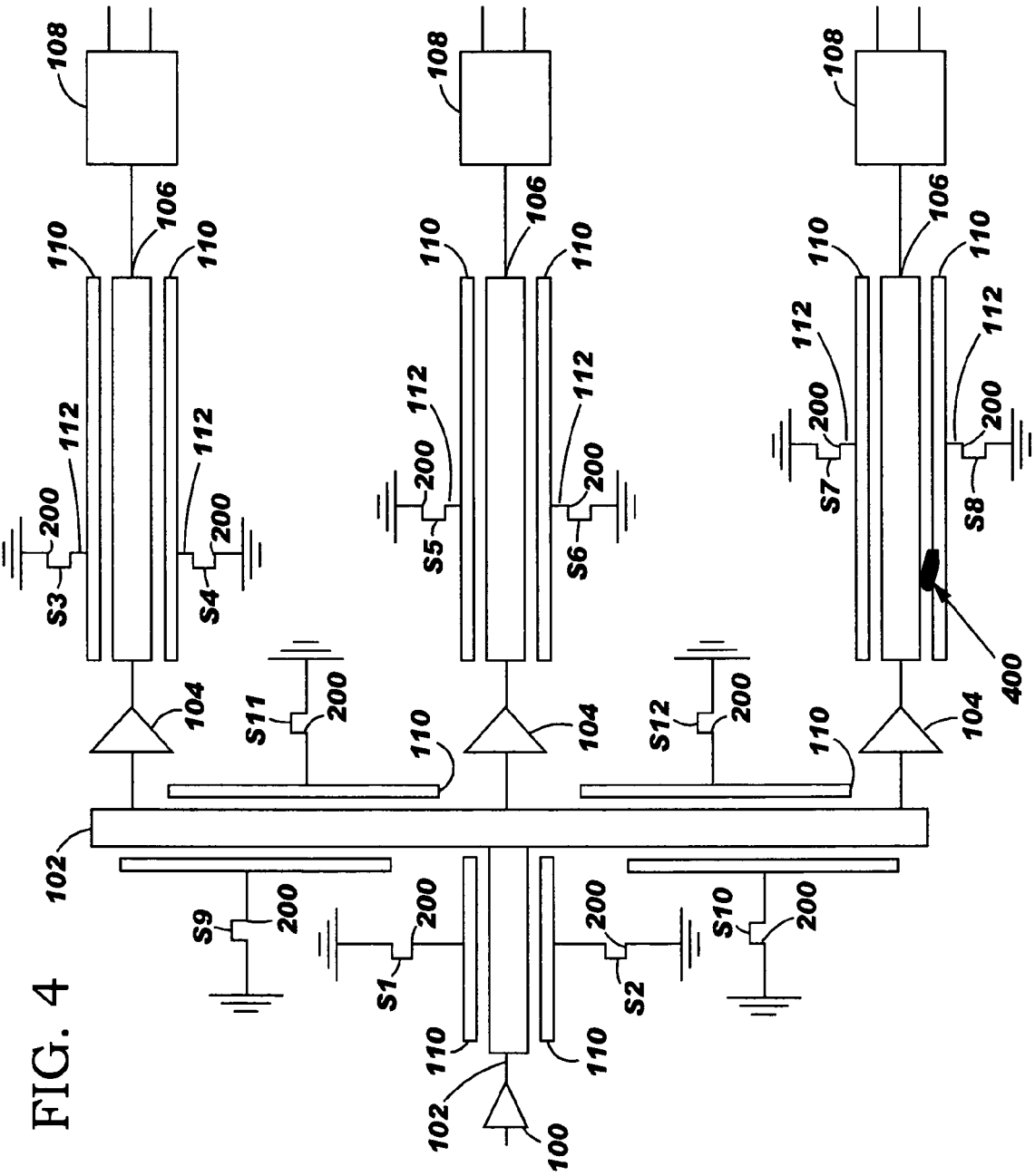
FIG. 4 is a schematic diagram of a shielded clock circuit with a defect.

By sequencing the pull down switches 200 carefully, the location and level of a faulty bridged clock segment can be identified. A short defect between a clock segment and one of the switched shields will only cause a fault when the shield is connected to ground when the corresponding switch is active. Note, while the pull downs are shown as individual transistors, it may be electrically beneficial to use several distributed transistors to implement the switches instead. This would lower the shields impedance to ground and improve the effectiveness of the shielding. Also note that the control signals S1–SN can be controlled via a scan chain, or by an onboard sequencer. FIG. 4 illustrates a fault scenario with a short defect 400 in the lower shield in the clock segment in the lower right side. When such a fault occurs, the clock will be shorted to ground through the switch. This will interfere with normal clock function which will allow the fault to be measured functionally through standard test means. Alternately, the ground fault on the clock may be detected as an IDDq fault. With the invention, this defect will be located when signals S1–S7 have been set off (logic 0) while S8 is turned on (logic 1).

Figure 5:
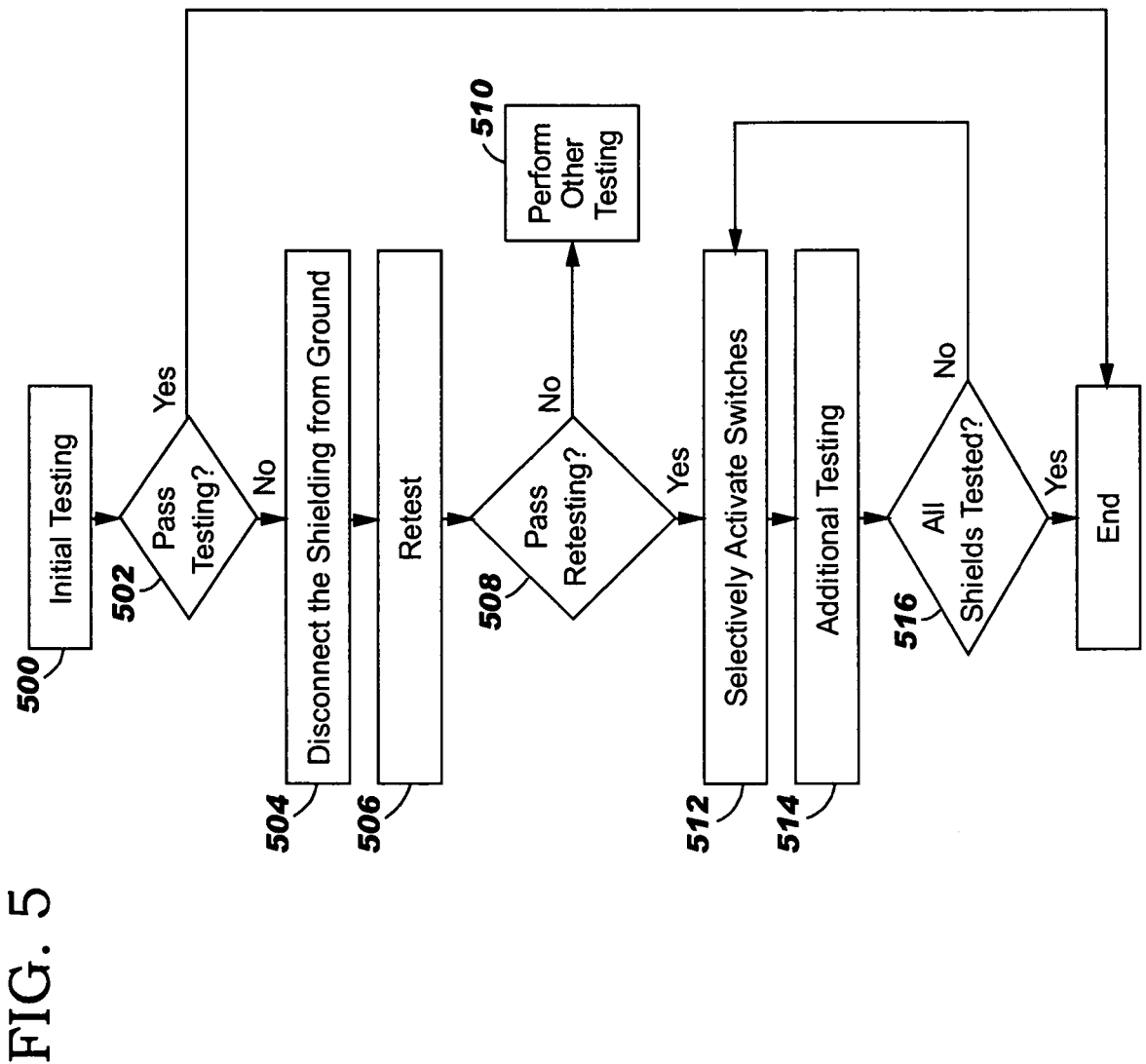
FIG. 5 is a flow diagram illustrating a preferred method of the invention.

The process of testing with the invention is shown in FIG. 5. In item 500, the invention first performs initial testing of the shielded clock tree. If the shielded clock tree fails the initial testing (502), the invention activates the switches that are connected to the shielding that is adjacent to the clock signal wiring to disconnect the shielding from ground 504, and then retests 506 the shielded clock tree. If the shielded clock tree passes this retesting process 508, this indicates that the initial test failure was probably caused by one of the clock signal wires shorting to ground through one of the shields. If it fails this retesting process 508, the initial failure was caused by some other type of defect and other testing (unrelated to the present invention) is performed in block 510.

Therefore, if the shielded clock tree passes the retesting process 506, in order to determine the location of the defect, the invention selectively activates the switches 512 to selectively disconnect portions of the shielding from ground (e.g., disconnecting one or more shield wire at a time), and then repeatedly tests 514 the shielded clock tree with different switches activated to locate one or more defects, until all shields have been tested 516. During this process of disconnecting individual (or groups of) shield wires from ground 512, if the shielded clock tree passes the retesting process, this indicates that a short between a clock signal wire and the shield wire(s) that was disconnected may be one of the sources of the defect(s) that caused the shielded clock tree to fail the initial testing. This allows the invention to know precisely which shield wire (or group of shield wires) has potentially caused the defect. This allows the circuit design or manufacturing process to be corrected.

Thus, as shown above, the invention modifies the clock shielding wires to allow them to double as sensitive defect monitors. This on-product approach tracks actual product defect levels more accurately, provides substantial critical area in which to detect defects, and uses less dedicated silicon area than traditional kerf-based defect monitors. This invention replaces the fixed wiring used to bias the shields to ground with circuits that can switch the shields into a high impedance state or connect them to ground. These circuits can be used to detect defects, which have shorted the shield to the clock. By controlling the selection of these switches, detailed information regarding the frequency and layer of defects can be gathered on a large number of manufactured chips. The invention allows information to be gathered to improve the yield of a specific design as well as information that can be used to improve the yield of an entire design process. The switches can also be programmed to allow shorted shield wires to 'float' allowing an otherwise faulted design to work.

While the invention has been described in terms of preferred embodiments, those skilled in the art will recognize that the invention can be practiced with modification within the spirit and scope of the appended claims.

What is claimed is:

1. An integrated circuit having a shielded clock tree comprising:

at least one clock signal buffer;

clock signal wiring connected to said clock signal buffer;

shielding adjacent said clock signal wiring;

ground wiring connecting said shielding to a predetermined voltage; and switches in said ground wiring, wherein said switches are connected to a test controller.

2. The integrated circuit in claim 1, wherein said switches are adapted to connect said shielding to said predetermined voltage during non-test operations and to selectively disconnect said shielding from said predetermined voltage during test operations.

3. The integrated circuit in claim 1, wherein said switches are individually controllable such that different portions of said shielded clock tree can be isolated during testing to locate defects.

4. The integrated circuit in claim 1, wherein said at least one clock signal buffer comprises a main clock signal buffer connected to a plurality of secondary clock signal buffers by said clock signal wiring.

5. The integrated circuit in claim 1, wherein said shielding comprises shield wires positioned adjacent and parallel to said clock signal wiring.

6. The integrated circuit in claim 1, wherein said predetermined voltage comprises a ground voltage level.

7. The intergrated circuit in claim 1, wherein each of said switches is connected to a plurality of ground wires.

* * * * *